(12) United States Patent
Dyer et al.

(10) Patent No.: US 12,489,421 B2
(45) Date of Patent: Dec. 2, 2025

(54) TRANSVERSELY-EXCITED FILM BULK ACOUSTIC RESONATOR WITH MULTI-MARK, MULTI-PITCH INTERDIGITAL TRANSDUCER

(71) Applicant: Murata Manufacturing Co., Ltd., Nagaokakyo (JP)

(72) Inventors: Greg Dyer, Santa Barbara, CA (US); Bryant Garcia, Mississauga (CA); Julius Koskela, Helsinki (FI)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 249 days.

(21) Appl. No.: 17/950,019

(22) Filed: Sep. 21, 2022

(65) Prior Publication Data
US 2023/0019694 A1     Jan. 19, 2023

Related U.S. Application Data

(63) Continuation of application No. 17/388,745, filed on Jul. 29, 2021, now Pat. No. 12,088,281.

(60) Provisional application No. 63/144,977, filed on Feb. 3, 2021.

(51) Int. Cl.
 *H03H 9/56*  (2006.01)
 *H03H 9/13*  (2006.01)
 *H03H 9/17*  (2006.01)

(52) U.S. Cl.
 CPC ............... *H03H 9/56* (2013.01); *H03H 9/13* (2013.01); *H03H 9/17* (2013.01)

(58) Field of Classification Search
 CPC ............... H03H 9/56; H03H 9/13; H03H 9/17
 See application file for complete search history.

(56) References Cited

U.S. PATENT DOCUMENTS

| | | | |
|---|---|---|---|
| 5,189,777 A | 3/1993 | Guckel et al. |
| 5,204,575 A | 4/1993 | Kanda et al. |
| 5,274,345 A | 12/1993 | Gau |
| 5,446,330 A | 8/1995 | Eda et al. |
| 5,552,655 A | 9/1996 | Stokes et al. |
| 5,631,515 A | 5/1997 | Mineyoshi et al. |

(Continued)

FOREIGN PATENT DOCUMENTS

| | | | |
|---|---|---|---|
| CN | 106788318 A | 5/2017 |
| CN | 209017001 A | 6/2019 |

(Continued)

OTHER PUBLICATIONS

Gorisse et al., "Lateral Field Excitation of membrane-based Aluminum Nitride resonators," Joint Conference of the IEEE International Frequency Control and the European Frequency and Time Forum (FCS), May 2011, 5 pages.

(Continued)

*Primary Examiner* — Samuel S Outten
(74) *Attorney, Agent, or Firm* — ArentFox Schiff LLP

(57) ABSTRACT

Acoustic resonator devices and acoustic filter devices. An acoustic resonator includes a piezoelectric plate having front and back surfaces. The back surface is attached to a surface of a substrate. The piezoelectric plate comprises a diaphragm spanning a cavity. A conductor pattern is formed on the front surface. The conductor pattern includes a multi-mark multi-pitch interdigital transducer (IDT), wherein fingers of the IDT are on the diaphragm.

20 Claims, 10 Drawing Sheets

(56) References Cited

U.S. PATENT DOCUMENTS

| | | |
|---|---|---|
| 5,726,610 A | 3/1998 | Allen et al. |
| 5,729,186 A | 3/1998 | Seki et al. |
| 5,853,601 A | 12/1998 | Krishaswamy |
| 5,952,899 A | 9/1999 | Kadota et al. |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,670,866 B2 | 12/2003 | Ella et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,554,427 B2 | 6/2009 | Matsumoto |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,154,111 B2 | 10/2015 | Bradley |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,332 B2 | 8/2019 | Bhattacharjee |
| 10,389,391 B2 | 8/2019 | Ito |
| 10,476,469 B2 | 11/2019 | Gong et al. |
| 10,491,192 B1 | 11/2019 | Plesski |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,819,319 B1 | 10/2020 | Hyde |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,206,009 B2 | 12/2021 | Plesski |
| 11,228,296 B2 | 1/2022 | Dyer |
| 11,239,816 B1 | 2/2022 | Mchugh |
| 11,239,822 B2 | 2/2022 | Garcia |
| 11,264,966 B2 | 3/2022 | Yantchev |
| 11,264,969 B1 | 3/2022 | Fenzi |
| 11,271,539 B1 | 3/2022 | Yantchev |
| 11,271,540 B1 | 3/2022 | Yantchev |
| 11,283,424 B2 | 3/2022 | Turner |
| 11,309,865 B1 | 4/2022 | Guyette |
| 11,323,089 B2 | 5/2022 | Turner |
| 11,323,090 B2 | 5/2022 | Garcia |
| 11,323,091 B2 | 5/2022 | Kay |
| 11,323,095 B2 | 5/2022 | Garcia |
| 11,323,096 B2 | 5/2022 | Yantchev |
| 11,349,450 B2 | 5/2022 | Yantchev |
| 11,349,452 B2 | 5/2022 | Yantchev |
| 11,356,077 B2 | 6/2022 | Garcia |
| 11,368,139 B2 | 6/2022 | Garcia |
| 11,374,549 B2 | 6/2022 | Yantchev |
| 11,381,221 B2 | 7/2022 | McHugh |
| 11,437,976 B2 | 9/2022 | Kaneda et al. |
| 2002/0079986 A1 | 6/2002 | Ruby et al. |
| 2002/0130736 A1 | 9/2002 | Mukai |
| 2002/0153970 A1 | 10/2002 | Noto |
| 2002/0158714 A1 | 10/2002 | Kaitila et al. |
| 2002/0189062 A1 | 12/2002 | Lin et al. |
| 2002/0190814 A1 | 12/2002 | Yamada et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0130410 A1 | 7/2004 | Nishimura et al. |
| 2004/0140866 A1 | 7/2004 | Taniguchi |
| 2004/0207033 A1 | 10/2004 | Koshido |
| 2004/0207485 A1 | 10/2004 | Kawachi et al. |
| 2004/0233020 A1 | 11/2004 | Nakamura |
| 2004/0261250 A1 | 12/2004 | Kadota et al. |
| 2005/0077982 A1 | 4/2005 | Funasaka |
| 2005/0099091 A1 | 5/2005 | Mishima |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0055485 A1 | 3/2006 | Lobeek |
| 2006/0131731 A1 | 6/2006 | Sato |
| 2006/0152107 A1 | 7/2006 | Tanaka |
| 2006/0179642 A1 | 8/2006 | Kawamura |
| 2007/0029679 A1 | 2/2007 | Selmeier et al. |
| 2007/0030096 A1 | 2/2007 | Nichihara et al. |
| 2007/0090898 A1 | 4/2007 | Kando et al. |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0278898 A1 | 12/2007 | Miura et al. |
| 2008/0018414 A1 | 1/2008 | Inoue et al. |
| 2008/0100397 A1 | 5/2008 | Nam et al. |
| 2008/0246559 A1 | 10/2008 | Ayazi |

(56) References Cited

U.S. PATENT DOCUMENTS

| | | |
|---|---|---|
| 2008/0297280 A1 | 12/2008 | Thalhammer |
| 2009/0114798 A1 | 5/2009 | Tigli et al. |
| 2009/0273415 A1 | 11/2009 | Frank |
| 2009/0315640 A1 | 12/2009 | Umeda |
| 2010/0019866 A1 | 1/2010 | Hara et al. |
| 2010/0064492 A1 | 3/2010 | Tanaka |
| 2010/0117483 A1 | 5/2010 | Tanaka |
| 2010/0123367 A1 | 5/2010 | Tai et al. |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0199163 A1 | 8/2011 | Yamanaka |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0300519 A1 | 11/2013 | Tamasaki et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0015624 A1 | 1/2014 | Kishino |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0049920 A1 | 2/2016 | Kishino |
| 2016/0087187 A1 | 3/2016 | Burak |
| 2016/0182009 A1 | 6/2016 | Bhattacharjee |
| 2016/0261038 A1 | 9/2016 | Tanaka |
| 2016/0285430 A1 | 9/2016 | Kikuchi et al. |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201235 A1 | 7/2017 | Freisleben |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1* | 5/2018 | Gong ................ H10N 30/8542 |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2018/0369816 A1 | 12/2018 | Ai et al. |
| 2019/0007022 A1 | 1/2019 | Goto et al. |
| 2019/0044498 A1 | 2/2019 | Kawasaki |
| 2019/0068155 A1 | 2/2019 | Kimura |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0181832 A1 | 6/2019 | Schmalzl et al. |
| 2019/0181833 A1 | 6/2019 | Nosaka |
| 2019/0190487 A1 | 6/2019 | Yasuda |
| 2019/0207583 A1 | 7/2019 | Miura et al. |
| 2019/0245509 A1 | 8/2019 | Hurwitz |
| 2019/0245518 A1 | 8/2019 | Ito |
| 2019/0253038 A1 | 8/2019 | Houlden |
| 2019/0273480 A1 | 9/2019 | Lin et al. |
| 2019/0305746 A1 | 10/2019 | Ota |
| 2019/0348966 A1 | 11/2019 | Campanella-Pineda |
| 2019/0379351 A1 | 12/2019 | Miyamoto et al. |
| 2019/0386633 A1 | 12/2019 | Plesski |
| 2019/0386635 A1* | 12/2019 | Plesski ............... H03H 9/02062 |
| 2019/0386636 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0028481 A1 | 1/2020 | Sun et al. |
| 2020/0028489 A1 | 1/2020 | Ta et al. |
| 2020/0036357 A1 | 1/2020 | Mimura |
| 2020/0083861 A1 | 3/2020 | Matsuo |
| 2020/0083862 A1 | 3/2020 | Makkonen et al. |
| 2020/0083863 A1 | 3/2020 | Makkonen et al. |
| 2020/0153412 A1 | 5/2020 | Nosaka |
| 2020/0177160 A1 | 6/2020 | Jachowski |
| 2020/0228087 A1 | 7/2020 | Michigami et al. |
| 2020/0235719 A1 | 7/2020 | Yantchev et al. |
| 2020/0244247 A1 | 7/2020 | Maeda |
| 2020/0259480 A1 | 8/2020 | Pensala |
| 2020/0274520 A1 | 8/2020 | Shin |
| 2020/0313645 A1 | 10/2020 | Caron |
| 2020/0328725 A1 | 10/2020 | Jo et al. |
| 2020/0350891 A1 | 11/2020 | Turner |
| 2020/0358424 A1* | 11/2020 | Kaneda ................ H03H 9/25 |
| 2021/0006229 A1 | 1/2021 | Yantchev |
| 2021/0013859 A1 | 1/2021 | Turner et al. |
| 2021/0013860 A1 | 1/2021 | Dyer et al. |
| 2021/0067138 A1 | 3/2021 | Yantchev |
| 2021/0091749 A1 | 3/2021 | Plesski et al. |
| 2021/0119595 A1 | 4/2021 | Turner et al. |
| 2021/0126624 A1 | 4/2021 | Hiramatsu et al. |
| 2021/0152154 A1 | 5/2021 | Tang |
| 2021/0265978 A1 | 8/2021 | Plesski et al. |
| 2021/0273631 A1 | 9/2021 | Jachowski et al. |
| 2021/0328574 A1 | 10/2021 | Garcia |
| 2021/0351762 A1 | 11/2021 | Dyer et al. |
| 2021/0399750 A1 | 12/2021 | Varela Campelo |
| 2022/0067138 A1 | 3/2022 | Paert et al. |
| 2022/0103160 A1 | 3/2022 | Jachowski et al. |
| 2022/0116014 A1 | 4/2022 | Poirel |
| 2022/0149808 A1 | 5/2022 | Dyer et al. |
| 2022/0200567 A1 | 6/2022 | Garcia |

FOREIGN PATENT DOCUMENTS

| | | |
|---|---|---|
| CN | 110417373 A | 11/2019 |
| CN | 210431367 U | 4/2020 |
| CN | 112787614 A | 5/2021 |
| CN | 113839643 A | 12/2021 |
| GB | 2578958 A | 6/2020 |
| JP | H10209804 A | 8/1998 |
| JP | 2001244785 A | 9/2001 |
| JP | 2020155967 A | 9/2002 |
| JP | 2002300003 A | 10/2002 |
| JP | 2003078389 A | 3/2003 |

(56) References Cited

FOREIGN PATENT DOCUMENTS

| | | |
|---|---|---|
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2018166259 A | 10/2018 |
| JP | 2018207144 A | 12/2018 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 7/2016 |
| WO | 2016147687 A1 | 9/2016 |
| WO | 2018003268 A1 | 1/2018 |
| WO | 2018003273 | 1/2018 |
| WO | 2018163860 A1 | 9/2018 |
| WO | 2019/111664 A1 | 6/2019 |
| WO | 2020092414 A2 | 5/2020 |

OTHER PUBLICATIONS

Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.

Yandrapalli et al., "Toward Band n78 Shear Bulk Acoustic Resonators Using Crystalline Y-Cut Lithium Niobate Films With Spurious Suppression," Journal of Microelectromechanical System, Aug. 2023, vol. 32, No. 4, pp. 327-334.

International Search Report and Written Opinion in PCT/US2022/081068, mailed Apr. 18, 2023, 17 pages.

Office Action in JP2021175220, mailed Apr. 25, 2023, 10 pages.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 EEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

USPTO/ISA, International Search Report and Written Opinion for PCT Application No. PCT/US2022/022908, mail date Jul. 19, 2022.

(56) References Cited

OTHER PUBLICATIONS

USPTO/ISA, International Search Report and Written Opinion for PCT Application No. PCT/US2022/028378, mail date Aug. 19, 2022.
USPTO/ISA, International Search Report and Written Opinion for PCT Application No. PCT/US22/21206, mail date Jul. 7, 2022.
USPTO/ISA, International Search Report and Written Opinion for PCT Application No. PCT/US22/22632, mail date Jul. 19, 2022.
World Intellectual Property Organization, International Search Report and Written Opinion for International Application No. PCT/US2022/027796, mail date Aug. 17, 2022, 12 total pages, Aug. 17, 2022.
World Intellectual Property Organization, International Search Report and Written Opinion for International Application No. PCT/US2022/027798, mail date Sep. 6, 2022, 8 total pages, Sep. 6, 2022.
Wu et al., "Frequency band-gap measurement of two-dimensional air/silicon phononic crystals using layered slanted inger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.

* cited by examiner

007
TRANSVERSELY-EXCITED FILM BULK ACOUSTIC RESONATOR WITH MULTI-MARK, MULTI-PITCH INTERDIGITAL TRANSDUCER

RELATED APPLICATION INFORMATION

This patent is a continuation of application Ser. No. 17/388,745, filed Jul. 29, 2021, entitled TRANSVERSELY-EXCITED FILM BULK ACOUSTIC RESONATOR WITH MULTI-MARK INTERDIGITAL TRANSDUCER, which claims priority from provisional patent application 63/144,977, filed Feb. 3, 2021, entitled CHIRPED XBAR ELECTRODES, the entire content of which are incorporated herein by reference.

Application Ser. No. 17/388,745 is related to application Ser. No. 17/093,239, filed Nov. 9, 2020, entitled TRANSVERSELY-EXCITED FILM BULK ACOUSTIC RESONATOR WITH MULTI-PITCH INTERDIGITAL TRANSDUCER.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
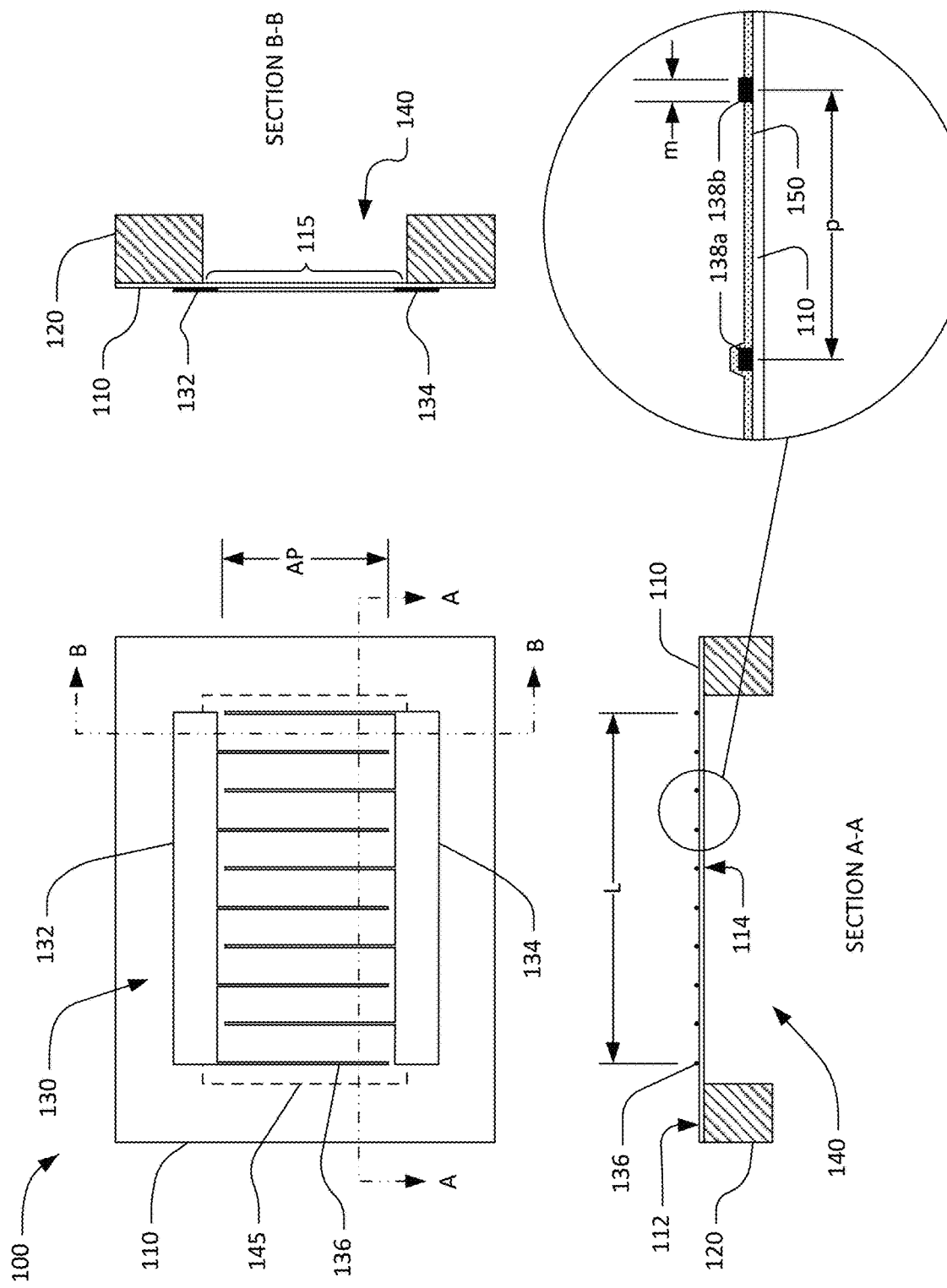
FIG. 1 includes a schematic plan view, two schematic cross-sectional views, and a detail view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials.

The IDT fingers 138a and 138b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers.

Figure 2:
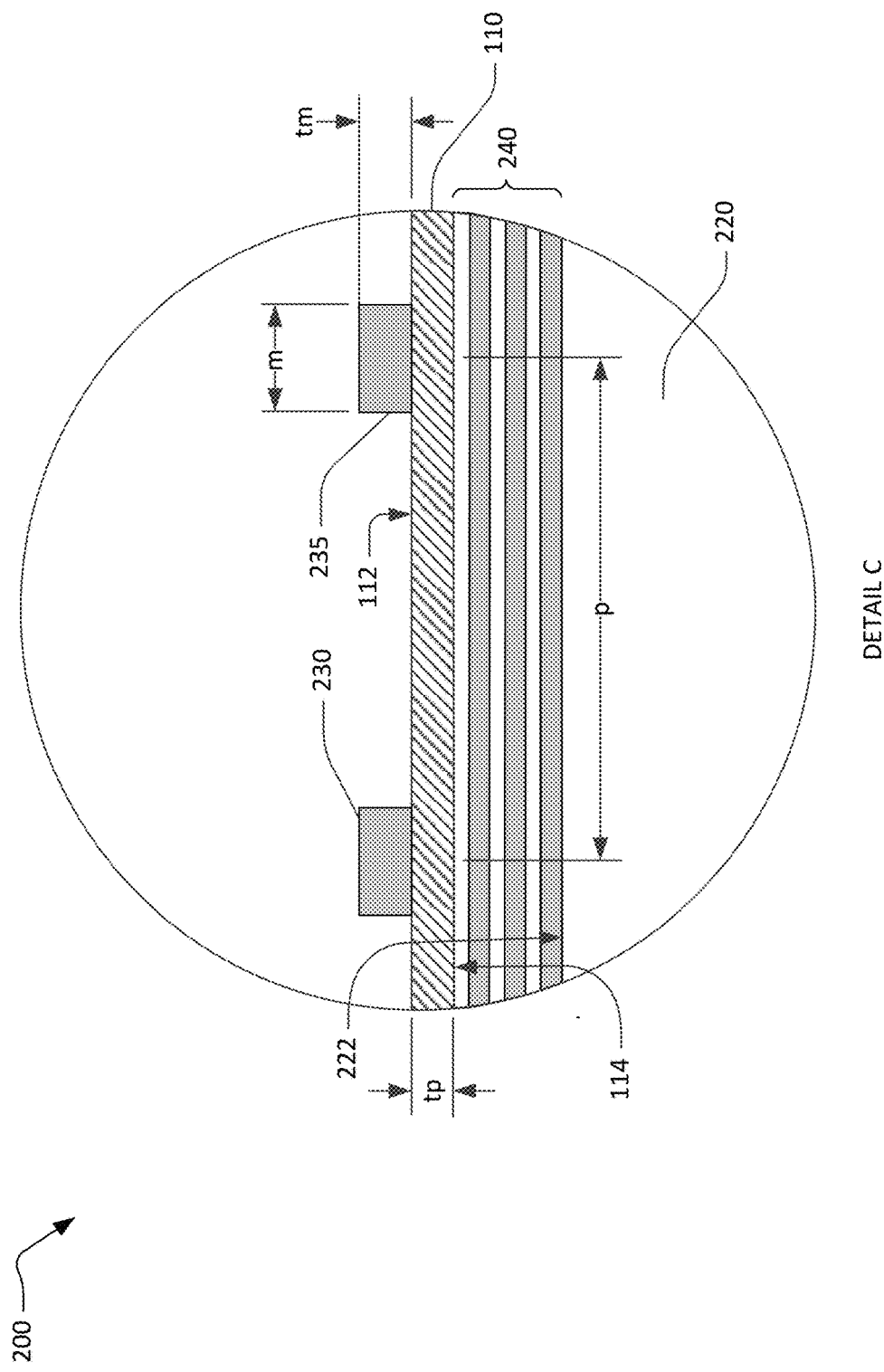
FIG. 2 is an alternative schematic cross-sectional view of an XBAR.

FIG. 2 shows a detailed schematic cross-sectional view of a solidly mounted XBAR (SM XBAR) 200. SM XBARs are first described in U.S. Pat. No. 10,601,392. The SM XBAR 200 includes a piezoelectric plate 110 and an IDT (of which only fingers 230 and 235 are visible). The piezoelectric layer 110 has parallel front and back surfaces 112, 114. Dimension tp is the thickness of the piezoelectric plate 110. The width (or mark) of the IDT fingers 230, 235 is dimension m, thickness of the IDT fingers is dimension tm, and the IDT pitch is dimension p.

In contrast to the XBAR device shown in FIG. 1, the IDT of an SM XBAR is not formed on a diaphragm spanning a cavity in a substrate (120 in FIG. 1). Instead, an acoustic Bragg reflector 240 is between a surface 222 of a substrate 220 and the back surface 114 of the piezoelectric plate 110. The acoustic Bragg reflector 240 is both disposed between and mechanically attached to a surface 222 of the substrate 220 and the back surface 114 of the piezoelectric plate 110. In some circumstances, thin layers of additional materials may be disposed between the acoustic Bragg reflector 240 and the surface 222 of the substrate 220 and/or between the Bragg reflector 240 and the back surface 114 of the piezoelectric plate 110. Such additional material layers may be present, for example, to facilitate bonding the piezoelectric plate 110, the acoustic Bragg reflector 240, and the substrate 220.

The acoustic Bragg reflector 240 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 240 has a thickness equal to, or about, one-fourth of the wavelength of a shear bulk wave having the same polarization as the primary acoustic mode at or near a resonance frequency of the SM XBAR 200. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide, and diamond. All of the high acoustic impedance layers of the acoustic Bragg reflector 240 are not necessarily the same material, and all of the low acoustic impedance layers are not necessarily the same material. In the example of FIG. 2, the acoustic Bragg reflector 240 has a total of six layers. An acoustic Bragg reflector may have more than, or less than, six layers.

As shown in FIG. 2, the IDT fingers 230, 235 have rectangular cross-sections. The IDT fingers 230, 235 may have some other cross-section, such as trapezoidal, T-shaped, or stepped. The IDT fingers 230, 235 are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 230, 235 and the piezoelectric plate 110. Although not shown in FIG. 2, some or all IDT fingers may be disposed in grooves or slots extending partially or completely through the piezoelectric plate 110.

Figure 3:
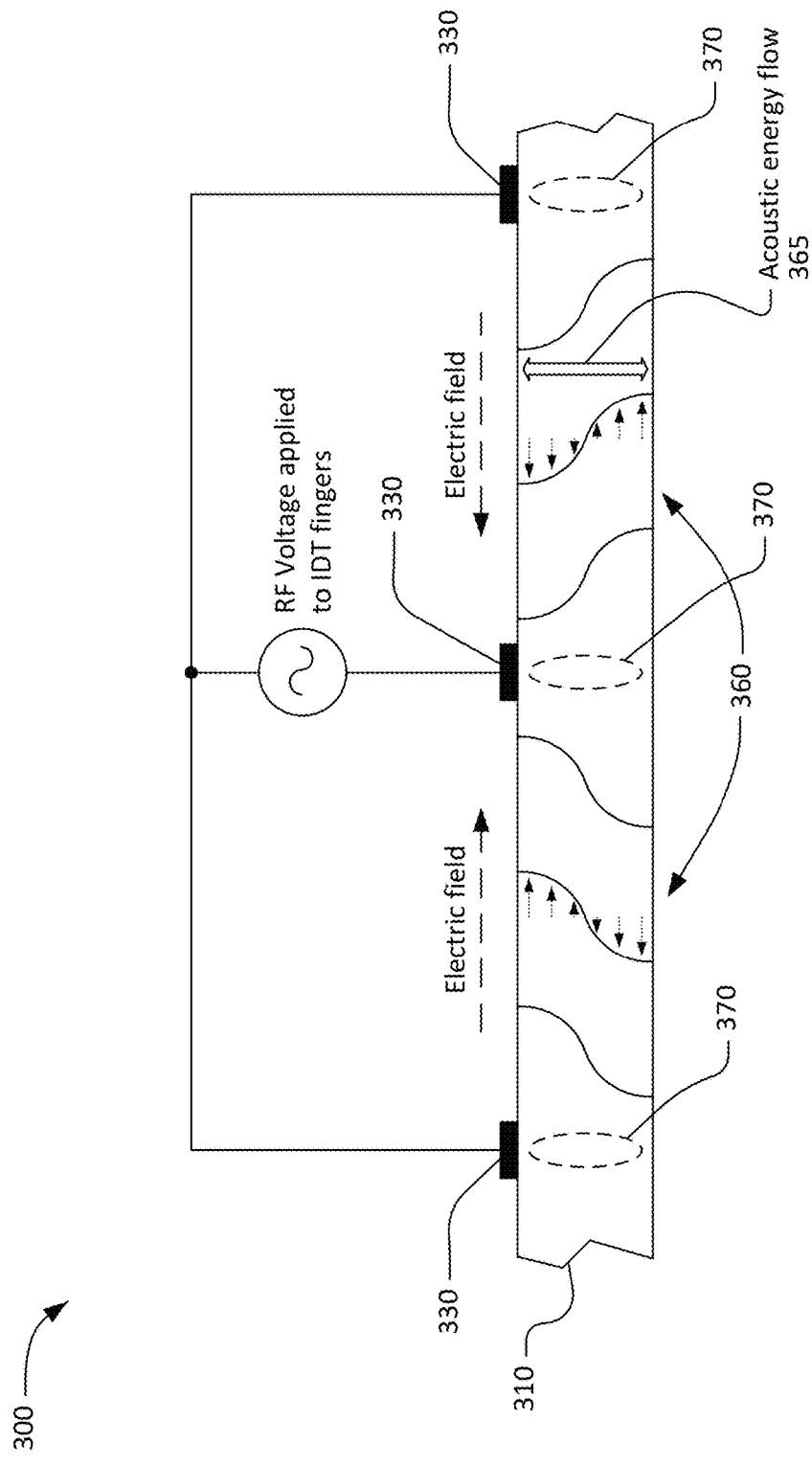
FIG. 3 is a graphic illustrating a shear horizontal acoustic mode in an XBAR.

FIG. 3 is a graphical illustration of the primary acoustic mode of interest in an XBAR. FIG. 3 shows a small portion of an XBAR 300 including a piezoelectric plate 310 and three interleaved IDT fingers 330 which alternate in electrical polarity from finger to finger. An RF voltage is applied to the interleaved fingers 330. This voltage creates a time-varying electric field between the fingers. The direction of the electric field is predominantly lateral, or parallel to the surface of the piezoelectric plate 310, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 310. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 300 are represented by the curves 360, with the adjacent small arrows providing a schematic indication of the direction and relative magnitude of atomic motion at the resonance frequency. The degree of atomic motion, as well as the thickness of the piezoelectric plate 310, have been greatly exaggerated for ease of visualization. While the atomic motions are predominantly lateral (i.e. horizontal as shown in FIG. 3), the direction of acoustic energy flow of the excited primary acoustic mode is substantially orthogonal to the surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

The XBAR primary acoustic mode is mostly bulk in nature, which can result in weak frequency dependence on mark and pitch. Thus, chirping (or variance) of mark, or mark and pitch, in the IDT of the XBAR can potentially suppress undesirable spurious modes that depend upon mark and/or pitch, such as metal and propagating modes, with only slight broadening of the primary mode resonance.

Figure 4:
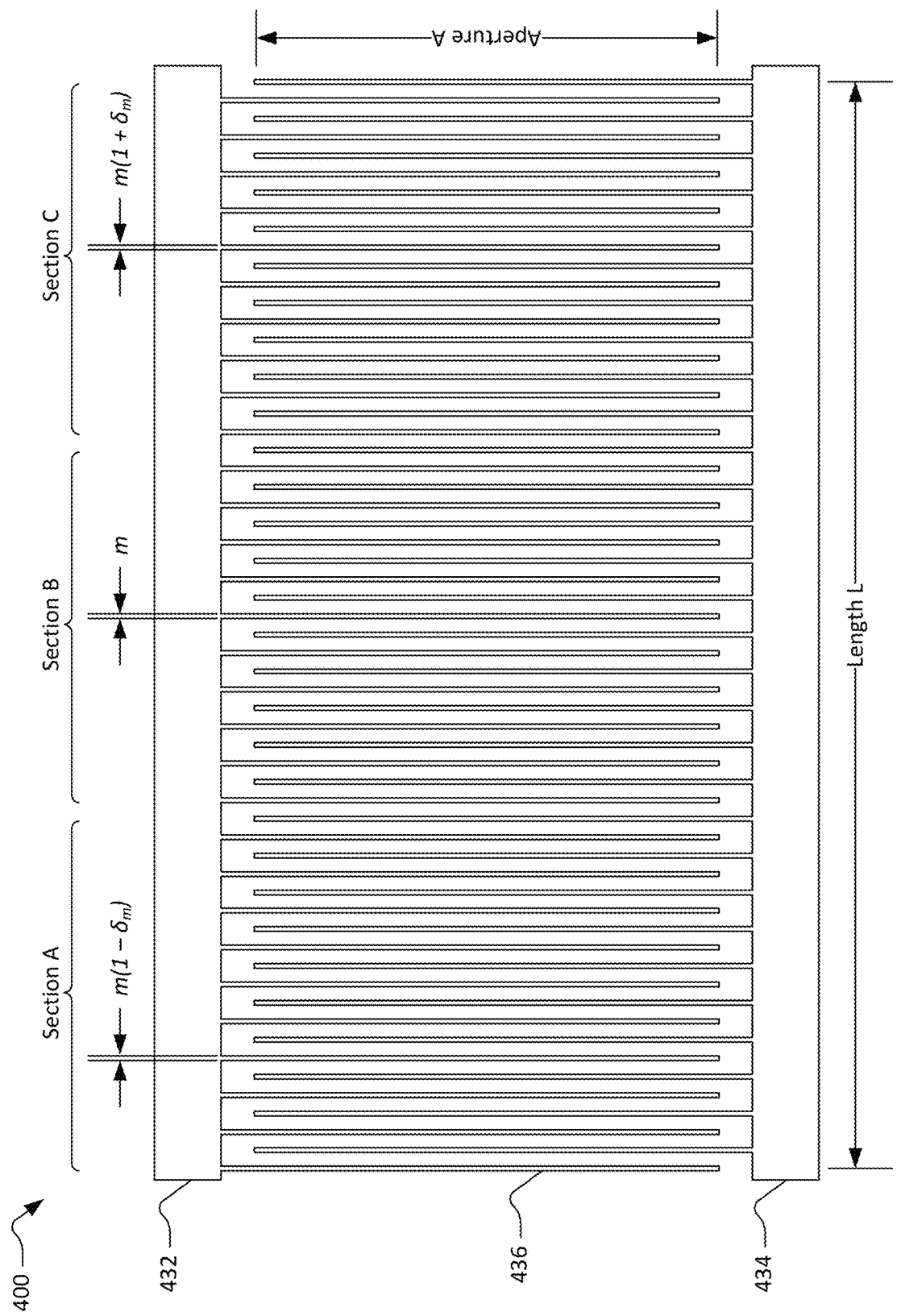
FIG. 4 is a plan view of a multi-mark interdigital transducer (IDT).

FIG. 4 is a plan view of an exemplary multi-mark IDT 400. A "multi-mark IDT" is an IDT where the mark of the IDT fingers varies along the length of the IDT. At any given point along the length, the mark may not vary across the aperture of the IDT. Further, the pitch, can be constant over the entire IDT. The multi-mark IDT 400 may be a portion of an XBAR such as the XBAR 100 of FIG. 1.

The multi-mark IDT 400 includes a first busbar 432, and a second busbar 434, and a plurality of interleaved fingers such as finger 436. The interleaved fingers extend alternately from the first and second busbars 432, 434. The multi-mark IDT 400 is divided into three sections, identified as Section A, Section B, and Section C, along the length L of the IDT. Each of Sections A, B, and C includes 20 fingers, for a total of 60 fingers in the multi-mark IDT 400. The use of three sections and 60 fingers is exemplary. An IDT may have more than or fewer than 60 total fingers. An IDT may be divided along its length into two or more sections, each of which includes a plurality of adjacent fingers. The total number of fingers may be divided essentially equally between the two or more sections. In this context, "essentially" means "as close as possible." For example, an IDT with 100 fingers divided into three sections with 33, 34, and 33 fingers is considered to be divided essentially equally. The total number of fingers may be divided unequally between the two or more sections.

In this example, the fingers in Section B have mark m, which is the nominal mark of the IDT. The finger of Section A have a mark of $m(1-\delta_m)$, and the fingers of Section C have a mark of $m(1+\delta_m)$. $\delta_m$ is greater than 0 and less than or equal to 0.05. $\delta_m$ may typically be less than 0.01. $\delta_m$ may be selected during a filter design to achieve the most effective reduction of spurious modes. At any point along the length L of the IDT 400, the mark is constant across the aperture A. The pitch of the IDT fingers is constant and the same in all sections. When an IDT is divided into two sections or more than three sections, the maximum mark may be $m(1+\delta_m)$ and the minimum mark may be $m(1-\delta_m)$.

In the example multi-mark IDT 400, the mark increases monotonically from left (as seen in the figure) to right. This is not necessarily the case in all multi-mark IDTs. The sections of a multi-mark IDT may be arranged in some other order. Further, in the multi-mark IDT 400, the change in mark between adjacent sections is constant. This is also not necessarily the case in all multi-mark IDTs. The change in mark between adjacent sections may be the same or different.

Figure 5:
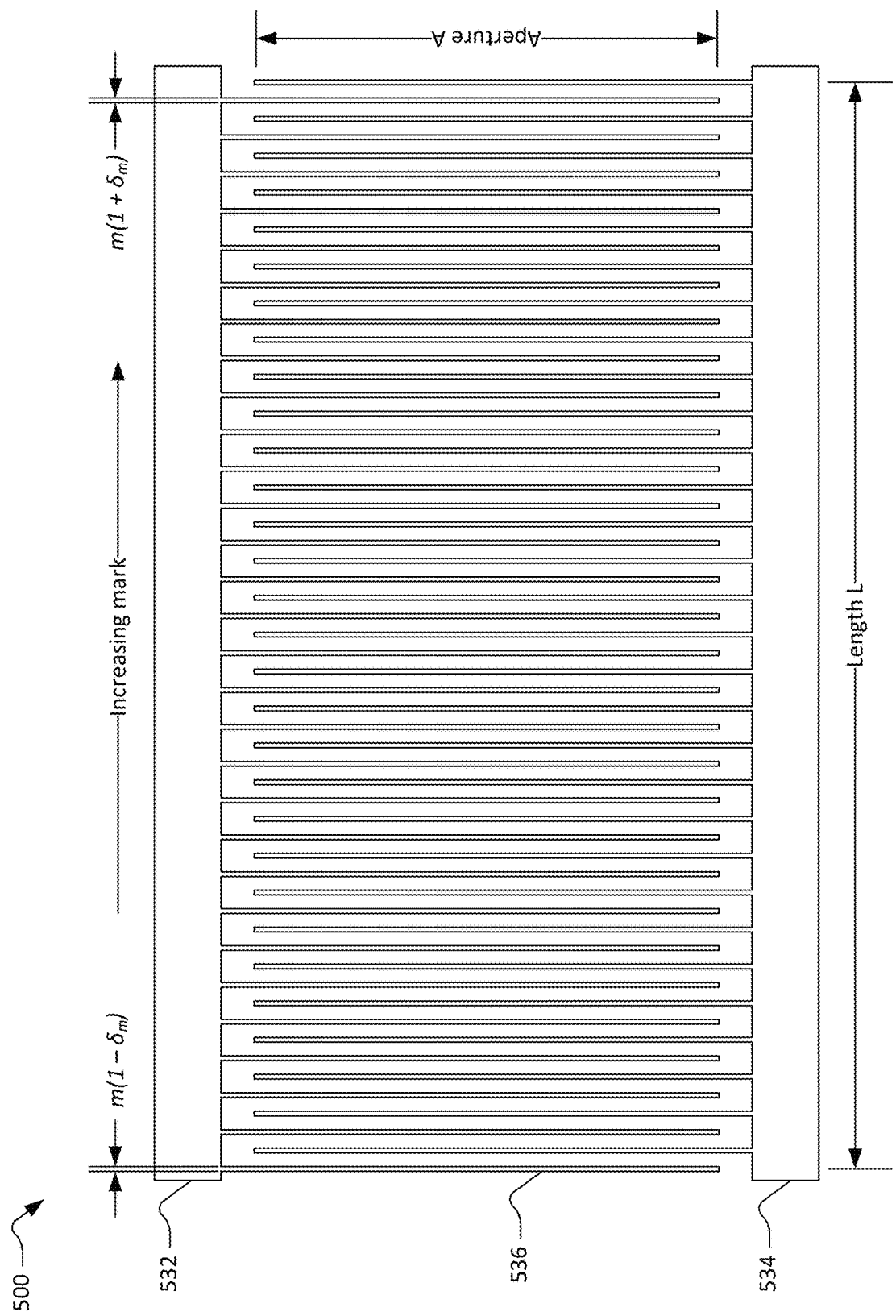
FIG. 5 is a plan view of another multi-mark IDT.

FIG. 5 is a plan view of another multi-mark IDT 500 with continuously varying mark. The IDT 500 includes a first busbar 532, and second busbar 534, and a plurality of interleaved fingers such as finger 536. The interleaved fingers extend alternately from the first and second busbars 532, 534. The IDT 500 is not divided into sections, but rather has a continuous change in mark for the fingers 536 along its length L. The IDT 500 has 60 fingers, which is exemplary. An IDT may have more than or fewer than 60 total fingers. The multi-mark IDT 500 may be a portion of an XBAR such as the XBAR 100 of FIG. 1.

As shown in FIG. 5, the mark at the left edge of the IDT 500 is $m(1-\delta_m)$, and the mark at the right edge of the IDT 500 is $m(1+\delta_m)$. The mark varies continuously between these two extremes. The variation in mark may typically, but not necessarily, be a linear function of position along the length L of the IDT. $\delta_m$ is greater than 0, less than or equal to 0.05, and typically less than 0.01. $\delta_m$ may be selected during a filter design to achieve the most effective reduction of spurious modes. At any point along the length of the IDT 500, the mark is constant across the aperture A. The pitch of the IDT fingers is constant over the entire IDT.

Figure 6:
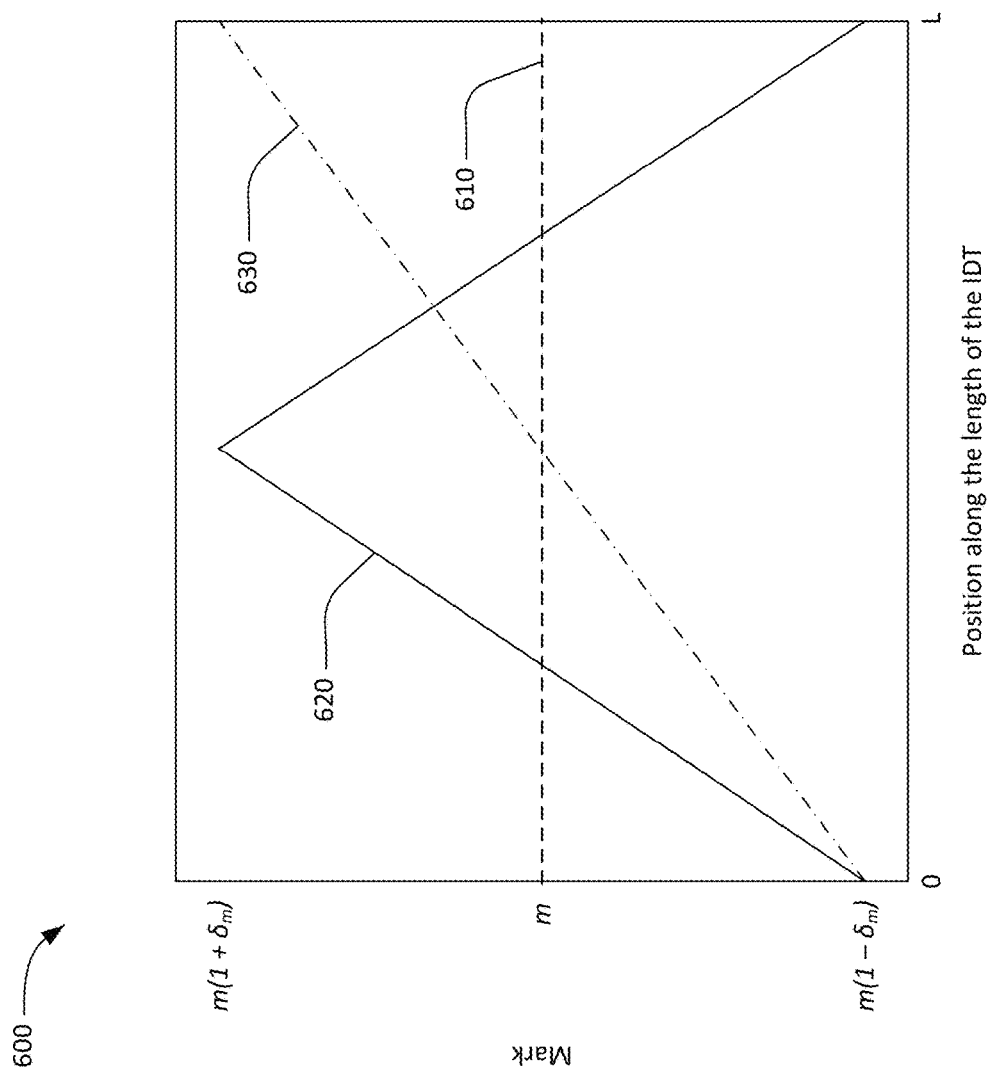
FIG. 6 is a graph of mark as a function of position along the length of the IDT for a conventional IDT and another multi-mark IDT.

FIG. 6 is a graph 600 of mark as a function of position along the length of the IDT for a conventional IDT and another exemplary multi-mark IDT. Dashed line 610 shows mark as a function of position along the length of the IDT for a conventional IDT where mark is not chirped. Solid line 620 shows mark as a function of position along the length of the IDT for a multi-mark IDT with chirped mark. In this example, a linear gradient is applied to the mark of the multi-mark IDT, such that the chirp has a triangular profile. There is a difference of 0.5 nm in the mark of each sequential finger, such that a mark of a widest finger is 20 nm more than a width of the narrowest finger. Dot dashed line 630 shows mark as a function of position along the length of the IDT for another multi-mark IDT with chirped mark where a linear gradient is applied to the mark of the multi-mark IDT. Other exemplary IDTs can have other differences in the mark between sequential fingers, e.g., differences in a range from 0.1 nm to 0.9 nm, and a difference between the widest finger and the narrowest finger can be other values, e.g., in a range from 1 nm to 100 nm.

Figure 7:
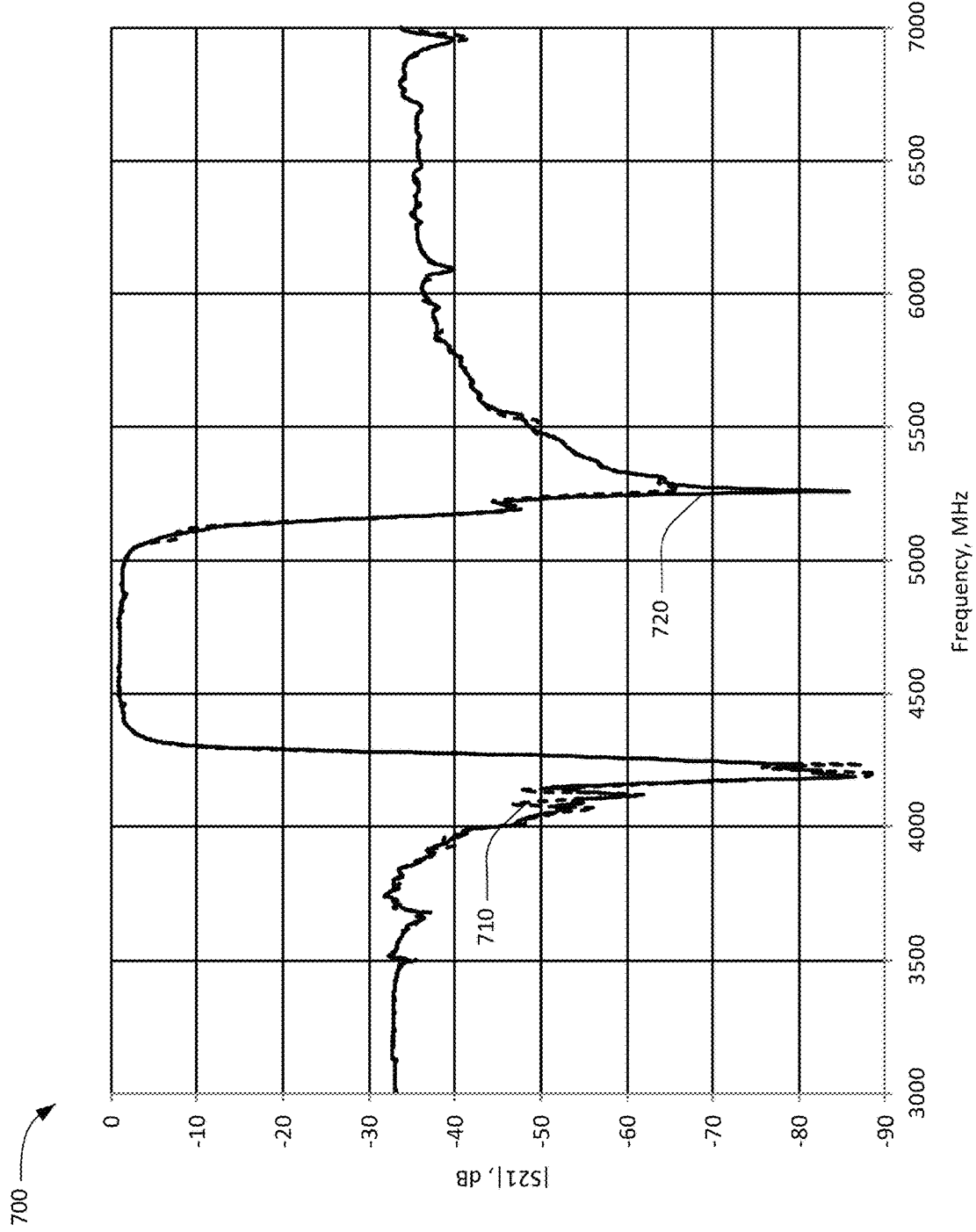
FIG. 7 is a graph of the magnitude of an input transfer function as a function of frequency for a filter with XBARs with a conventional IDT and a filter with XBARs multi-mark IDTs.

FIG. 7 is a graph 700 of the magnitude of S2,1, the input/output transfer function, for two bandpass filters implemented with XBAR devices. The S2,1 data was determined by simulation of the two filters using a finite element method. The dashed curve 710 is a plot of S2,1 for a first filter using XBARs with conventional IDTs. The solid curve 720 is a plot of S2,1 for a second bandpass filter that has multi-mark IDTs but is otherwise identical the first bandpass filter. Comparison of the curves 710 and 720 shows the passbands of the two filters are very similar. Compared to the first filter, the second filter with multi-mark IDTs exhibits reduced peak admittance of spurious modes.

Figure 8:
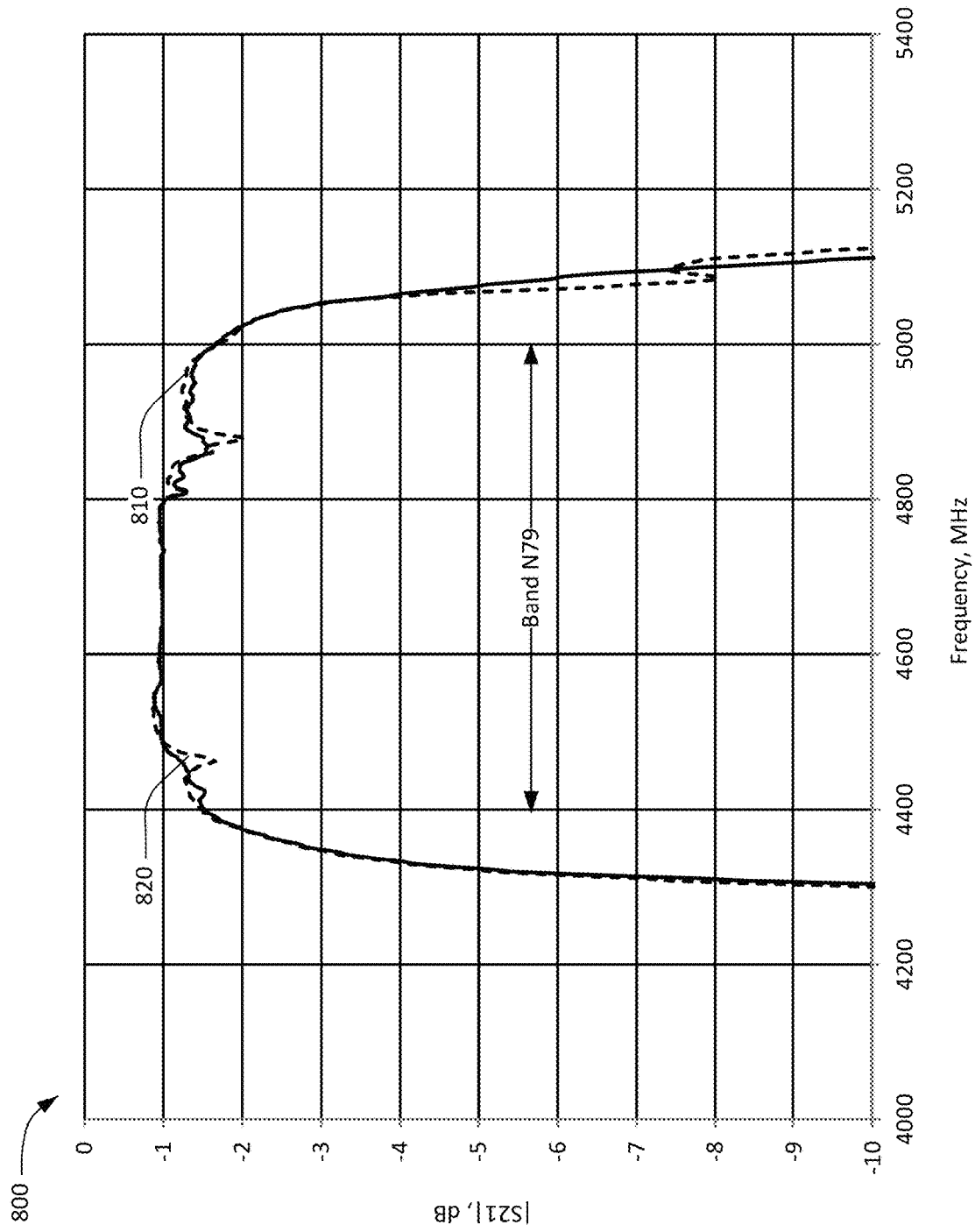
FIG. 8 is an expanded portion of the graph of FIG. 7.

Slight variations in the mark of the IDT in an XBAR can result in disruption or destructive interference of spurious modes with negligible effect on the shear primary mode. This effect is illustrated in FIG. 8, which is an expanded view of a portion of the graph of FIG. 7. In FIG. 8, the dashed curve 810 is a plot of the S21 versus frequency for the filter with the conventional IDTs. The solid curve 820 is a plot of the of the S21 versus frequency of the filter with the multi-mark IDTs. The filter with multi-mark IDTs has reduced spurious modes within the Band N79 passband as compared to the filter with conventional IDTs, which can result in less loss. The chirped mark of the multi-mark IDT has a negligible effect on the resonance and anti-resonance frequencies of the shear primary acoustic mode of the XBAR.

The filters used to generate the data shown in FIGS. 7 and 8 include 4 series resonators and 4 shunt resonators in a ladder filter circuit. All resonators are XBARs. These filters are exemplary. A filter may have less or more resonators, and more or less series resonators and shunt resonators. Multi-mark IDTs may be divided into two sections or more than three sections, or may be continuous. The number of sections may not be the same for all resonators in a filter, and a filter may include both sectioned and continuous multi-mark IDTs. The value of $\delta_m$ may be different for some or all of the resonators. A filter may contain a combination of resonators with uniform mark and multi-mark resonators.

Figure 9:
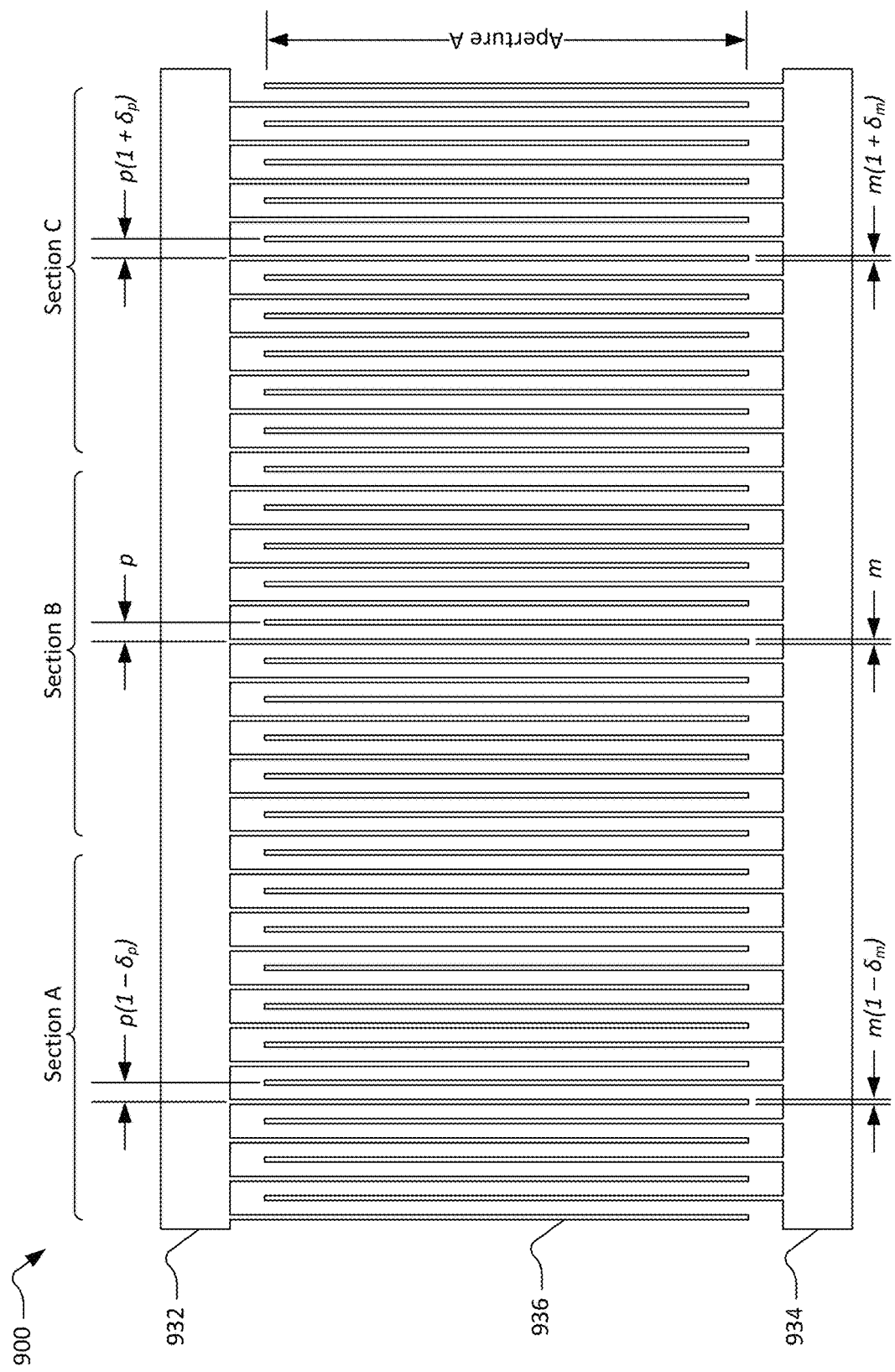
FIG. 9 is a plan view of a multi-mark multi-pitch IDT.

FIG. 9 is a plan view of an exemplary multi-pitch multi-mark IDT 900. A "multi-pitch IDT" is an IDT where the pitch of the IDT fingers varies along the length of the IDT. At any given point along the length, the pitch may not vary across the aperture of the IDT. Further, the mark can also vary along the length of the IDT, as described above, such that the IDT is a multi-mark multi-pitch IDT. The multi-pitch multi-mark IDT 900 may be a portion of an XBAR such as the XBAR 100 of FIG. 1.

The multi-pitch multi-mark IDT 900 includes a first busbar 932, and a second busbar 934, and a plurality of interleaved fingers such as finger 936. The interleaved fingers extend alternately from the first and second busbars 932, 934. As similarly described for FIG. 4 above, the multi-pitch multi-mark IDT 900 can be divided into three sections, identified as Section A, Section B, and Section C, along the length L of the IDT. Each of Sections A, B, and C includes 20 fingers, for a total of 60 fingers in the multi-pitch multi-mark IDT 900. The use of three sections and 60 fingers is exemplary. An IDT may have more than or fewer than 60 total fingers. An IDT may be divided along its length into two or more sections, each of which includes a plurality of adjacent fingers. The total number of fingers may be divided essentially equally between the two or more sections. In this context, "essentially" means "as close as possible." For example, an IDT with 100 fingers divided into three sections with 33, 34, and 33 fingers is considered to be divided essentially equally. The total number of fingers may be divided unequally between the two or more sections. The divisions can be the same or different from the divisions for the chirping of the mark.

In this example, the fingers in Section B have pitch p, which is the nominal pitch of the IDT. The finger of Section A have a pitch of $p(1-\delta_p)$, and the fingers of Section C have a pitch of $p(1+\delta_p)$. $\delta_p$ is greater than 0 and less than or equal to 0.05. $\delta_p$ may typically be less than 0.01. $\delta_p$ may be selected during a filter design to achieve the most effective reduction of spurious modes. At any point along the length L of the IDT 900, the pitch is constant across the aperture A. The mark of the IDT fingers also varies by sections, similar to the variation by section of IDT 400 shown in FIG. 4. The mark can vary by the same section as the pitch or by different sections than the pitch. Alternatively, the mark can vary continuously, similar to the continuous variation of mark shown in FIG. 5.

Figure 10:
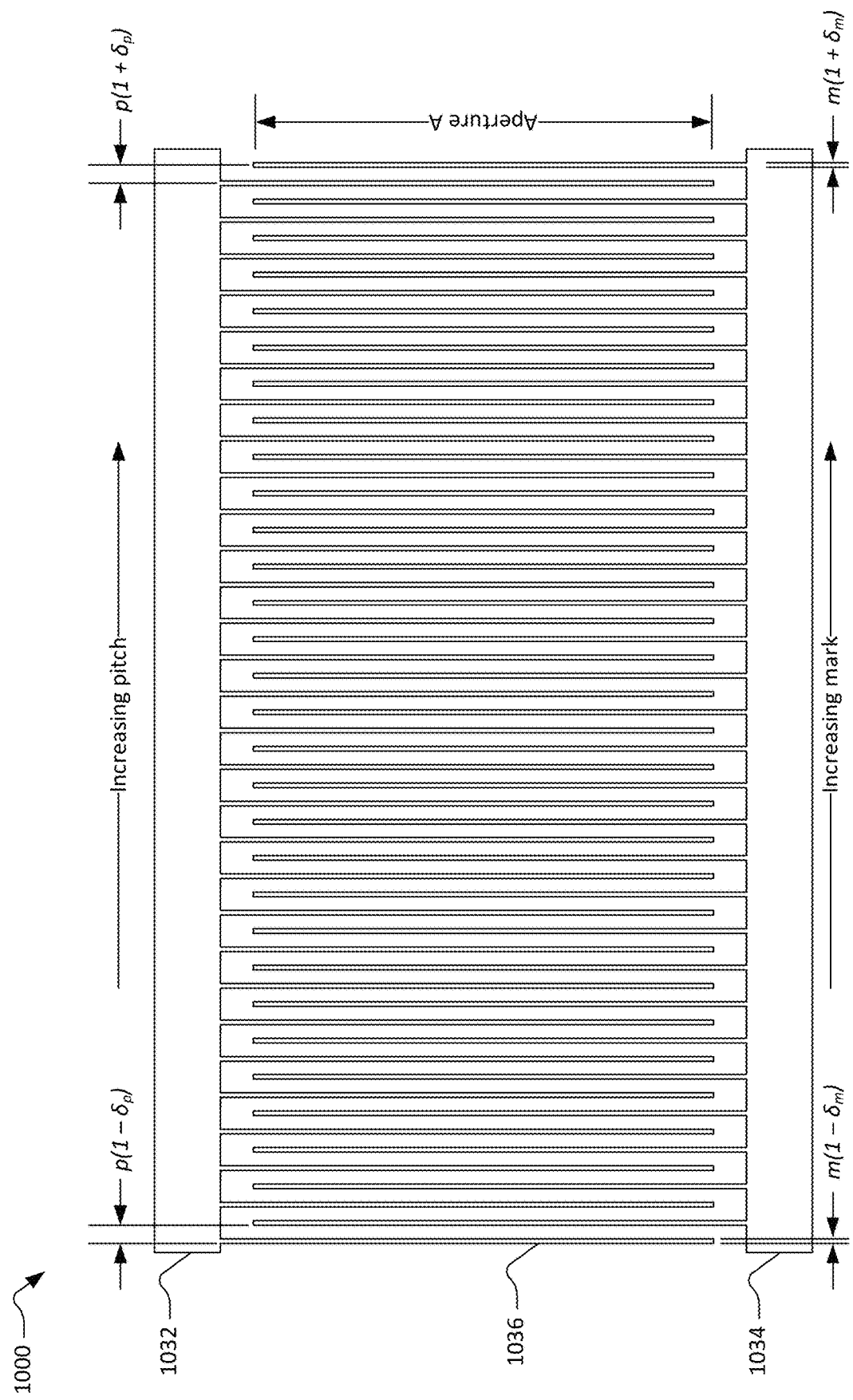
FIG. 10 is a plan view of another multi-mark multi-pitch IDT.

FIG. 10 is a plan view of another exemplary multi-pitch multi-mark IDT 1000. The multi-pitch multi-mark IDT 900 may be a portion of an XBAR such as the XBAR 100 of FIG. 1. The multi-pitch multi-mark IDT 1000 includes a first busbar 1032, and a second busbar 1034, and a plurality of interleaved fingers such as finger 1036. The interleaved fingers extend alternately from the first and second busbars 1032, 1034. In this example, the mark varies continuously, similar to the continuous variation of mark shown in FIG. 5. The pitch also varies continuously, similar to the mark. As shown in FIG. 10, the mark and pitch both increase continuously from left to right, as oriented in the figure. Alternatively, the either the mark or pitch could increase continuously from left to right, while the other of mark or pitch decreases continuously from left to right.

In other examples, the pitch of the IDT can vary continuously, similar to the continuous variation of mark shown in FIG. 5. The pitch may vary as the mark varies, or may vary at a different rate. The pitch and mark may both vary continuously. The pitch and/or the mark may vary between multiple maxima and minima along the length of the IDT. The mark may vary by section while the pitch varies continuously, or pitch may vary by section while the mark varies continuously. The mark may increase in one direction along the length of the IDT (either continuously or by section), while the pitch decreases in the same direction (either continuously or by section). Variation of mark and pitch can be optimized with respect to one another, and variation of mark and pitch can be different from one resonator to another, such that greatest suppression of spurious modes is achieved for best performance of the filter.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device having a passband, the filter device comprising:
    a piezoelectric layer having front and back surfaces, a portion of the back surface attached to a substrate either directly or via one or more intermediate layers, the piezoelectric layer comprising a plurality of diaphragms spanning respective cavities; and
    a conductor pattern on the front surface, the conductor pattern comprising a plurality of interdigital transducers (IDTs) of a plurality of bulk acoustic resonators, wherein interleaved fingers of the plurality of IDTs are on respective diaphragms of the plurality of diaphragms, wherein each of a first IDT and a second IDT from the plurality of IDTs is a multi-mark multi-pitch IDT have a length between outermost fingers of the interleaved fingers of the respective IDT, wherein:
the first and second IDTs are divided along the length into at least three sections, with each of a first section, a second section, and third section having multiple pairs of fingers of the plurality of interleaved fingers, wherein the first section is closer to a first outermost finger of the respective IDT, the third section is closer to a last outermost finger of the respective IDT, and the second section is between the first section and the third section, wherein a mark and a pitch of the interleaved fingers in each of the first, second and third sections are constant in each section of the respective IDT, wherein the pitch in each section of the first and second IDTs is different from the respective pitches of the other sections, wherein the pitch in each of the at least three sections of the first and second IDTs is measured as a center-to-center-spacing between adjacent fingers extending from different busbars in the respective section, and wherein a change in the pitch between the at least three sections has a smaller effect on a resonance frequency of a primary shear acoustic mode of all of the at least three sections of all of the respective bulk acoustic resonators in comparison to an effect that the change in the pitch has on an in-band spurious acoustic mode in the passband of the filter device other than the primary shear acoustic mode of all of the at least three sections.

2. The filter device of claim 1, wherein for each of the first IDT and the second IDT:
the mark of the interleaved fingers of the first section is $m(1-\delta_m)$,
the mark of the interleaved fingers of the third section is $m(1+\delta_m)$, and
$\delta_m$ is greater than 0 and less than or equal to 0.05.

3. The filter device of claim 2, wherein $\delta$ of the first IDT of a first bulk acoustic resonator of the plurality of bulk acoustic resonators is different than $\delta$ of the second IDT of a second bulk acoustic resonator of the plurality of bulk acoustic resonators.

4. The filter device of claim 1, wherein the respective primary shear acoustic modes are excited by respective IDTs of the plurality of IDTs in the respective diaphragms, and each of the primary shear acoustic modes is excited in response to a radio frequency signal applied to the respective IDT.

5. The filter device of claim 1, wherein one or more of the plurality of IDTs, in addition to the first IDT and the second IDT, are multi-mark multi-pitch IDTs.

6. The filter device of claim 1, wherein for each of the first IDT and the second IDT:
the pitch of the interleaved fingers in the second section is a pitch p that is a nominal pitch of the IDT,
the pitch of the interleaved fingers in the first section is a pitch of $p(1-\delta_p)$,
the pitch of the interleaved fingers in the third section is a pitch of $p(1+\delta_p)$, and
$\delta_p$ is greater than 0 and less than or equal to 0.05.

7. The filter device of claim 1, wherein the piezoelectric layer and the plurality of IDTs are configured such that a radio frequency signal applied to the respective IDT excites a primary shear acoustic mode in the diaphragm, the primary shear acoustic mode being a bulk shear mode where acoustic energy propagates along a direction substantially orthogonal to the front and back surfaces of the piezoelectric layer that is lateral to a direction of electric field generated by the respective IDT.

8. The filter device of claim 1, wherein the smaller effect is a smaller change in a primary shear acoustic mode amplitude than a change in a spurious acoustic mode amplitude.

9. The filter device of claim 1, wherein the mark of the interleaved fingers in each section of the first and second IDTs is a width of each of the interleaved fingers within each of the first, second, and third sections, and the mark of the interleaved fingers in each of the first, second and third sections of at least one of the first and second IDTs is constant in each section and across each of the first, second and third sections of the first and second IDTs.

10. An acoustic resonator, comprising:
a piezoelectric layer having front and back surfaces, a portion of the back surface attached to a substrate either directly or via one or more intermediate layers, the piezoelectric layer comprising a diaphragm spanning a cavity; and
a conductor pattern on the front surface, the conductor pattern comprising a multi-mark multi-pitch interdigital transducer (IDT) having a plurality of interleaved fingers and a length between outermost fingers of the interleaved fingers,
wherein the IDT is divided along the length into at least three sections, with each of a first section, a second section, and third section having multiple pairs of fingers of the plurality of interleaved fingers,
wherein the first section is closer to a first outermost finger of the IDT, the third section is closer to a last outermost finger of the IDT, and the second section is between the first section and the third section,
wherein a mark and a pitch of the interleaved fingers in each of the first, second and third sections are constant in each section,
wherein the pitch in each section is different from the respective pitches of the other sections,
wherein the pitch in each of the at least three sections is measured as a center-to-center-spacing between adjacent fingers extending from different busbars in the respective section,
wherein the acoustic resonator is a series resonator or a shunt resonator of a ladder filter having a passband, and
wherein a change in the pitch between the at least three sections has a smaller effect on a resonance frequency of a primary shear acoustic mode of all of the at least three sections of the acoustic resonator of the ladder filter in comparison to an effect that the change in the pitch has on an in-band spurious acoustic mode in the passband of the filter device other than the primary shear acoustic mode of all of the at least three sections.

11. The acoustic resonator of claim 10, wherein the primary shear acoustic mode is excited in response to a radio frequency signal applied to the IDT.

12. The acoustic resonator of claim 10, wherein:
the mark of the interleaved fingers of the first section is $m(1-\delta_m)$,
the mark of the interleaved fingers of the third section is $m(1+\delta_m)$, and
δm is greater than 0 and less than or equal to 0.05.

13. The acoustic resonator of claim 10, wherein:
the pitch of the interleaved fingers in the second section is a pitch p that is a nominal pitch of the IDT,
the pitch of the interleaved fingers in the first section is a pitch of $p(1-\delta_p)$,
the pitch of the interleaved fingers in the third section is a pitch of $p(1+\delta_p)$, and
$\delta_p$ is greater than 0 and less than or equal to 0 05.

14. The acoustic resonator of claim 10, wherein the piezoelectric layer and the IDT are configured such that a radio frequency signal applied to the IDT excites the primary shear acoustic mode in the diaphragm, the primary shear acoustic mode being a bulk shear mode where acoustic energy propagates along a direction substantially orthogonal to the front and back surfaces of the piezoelectric layer that is lateral to a direction of electric field generated by the IDT.

15. The acoustic resonator of claim 10, wherein the smaller effect is a smaller change in a primary shear acoustic mode amplitude than a change in a spurious acoustic mode amplitude.

16. The acoustic resonator of claim 10, wherein the ladder filter comprises at least one additional acoustic resonator having an IDT divided along a length into at least three sections that each have a plurality of interleaved fingers, and wherein a mark of the interleaved fingers in each of the at least three sections of the one additional acoustic resonator is constant in each section and across each section of the at least three sections.

17. An acoustic resonator, comprising:
a piezoelectric layer; and
a conductor pattern on a surface of the piezoelectric layer, the conductor pattern comprising a multi-mark multi-pitch interdigital transducer (IDT) having interleaved fingers,
wherein the IDT is divided along a length of the IDT into at least three sections, including a first section, a second section and a third section, such that a total number of the interleaved fingers of the IDT are divided essentially equally between the at least three sections,
wherein a mark and a pitch of the interleaved fingers in each of the first, second and third sections are constant in each section, the pitch being measured as a center-to-center-spacing between adjacent fingers extending from different busbars in the respective section,
wherein the pitch in each section is different from the respective pitches of the other sections of the at least three sections,
wherein the acoustic resonator is a series resonator or a shunt resonator of a ladder filter having a passband,
wherein the piezoelectric layer and the IDT are configured such that a radio frequency signal applied to the IDT excites a primary shear acoustic mode in the piezoelectric layer, the primary shear acoustic mode being a bulk shear mode where acoustic energy propagates along a direction substantially orthogonal to the surface of the piezoelectric layer and that is lateral to a direction of electric field generated by the IDT, and
wherein a change in the pitch between the at least three sections has a smaller effect on a resonance frequency of the primary shear acoustic mode of all of the at least three sections in comparison to an effect that the change in the pitch has on an in-band spurious acoustic mode in the passband of the filter device other than the primary shear acoustic mode of all of the at least three sections.

18. The acoustic resonator of claim 17, wherein:
the mark of the interleaved fingers of the first section is $m(1-\delta_m)$,
the mark of the interleaved fingers of the third section is $m(1+\delta_m)$, and
$\delta_m$ is greater than 0 and less than or equal to 0.05.

19. The acoustic resonator of claim 17, wherein:
the pitch of the interleaved fingers in the second section is a pitch p that is a nominal pitch of the IDT,
the pitch of the interleaved fingers in the first section is a pitch of $p(1-\delta_p)$,
the pitch of the interleaved fingers in the third section is a pitch of $p(1+\delta_p)$, and
$\delta_p$ is greater than 0 and less than or equal to 0.05.

20. The acoustic resonator of claim 17, wherein the smaller effect is a smaller change in a primary shear acoustic mode amplitude than a change in a spurious acoustic mode amplitude.

* * * * *